United States Patent [19]

Fujihara

[11] Patent Number: 5,270,566
[45] Date of Patent: Dec. 14, 1993

[54] INSULATED GATE SEMICONDUCTOR DEVICE

[75] Inventor: Tatsuhiko Fujihara, Matsumoto, Japan

[73] Assignee: Fuji Electric Co., Ltd., Kawasaki, Japan

[21] Appl. No.: 989,958

[22] Filed: Dec. 10, 1992

Related U.S. Application Data

[63] Continuation of Ser. No. 830,491, Jan. 23, 1992, abandoned, which is a continuation of Ser. No. 674,414, Mar. 22, 1991, abandoned, which is a continuation of Ser. No. 447,365, Dec. 7, 1989, abandoned.

[30] Foreign Application Priority Data

Dec. 8, 1988 [JP] Japan ................ 63-310395

[51] Int. Cl.⁵ .............. H01L 29/06; H01L 29/78; H01L 29/20; H01L 29/22
[52] U.S. Cl. ................ 257/368; 257/333; 257/389; 257/395; 257/356
[58] Field of Search .............. 357/23.11; 257/333, 257/368, 374, 389, 395, 396, 546, 356

[56] References Cited

U.S. PATENT DOCUMENTS

| | | |
|---|---|---|
| 3,793,721 | 8/1971 | Wakefield et al. ............ 437/58 |
| 4,654,121 | 3/1987 | Miller et al. ............ 357/23.11 |
| 4,819,045 | 4/1989 | Murakami ............ 357/23.11 |
| 4,825,278 | 4/1989 | Hillenius et al. ............ 357/23.11 |
| 4,855,800 | 8/1989 | Esquivel et al. ............ 357/23.11 |
| 4,918,510 | 4/1990 | Pfiester ............ 357/23.11 |
| 4,926,222 | 5/1990 | Kosa et al. ............ 357/23.11 |

FOREIGN PATENT DOCUMENTS

2087648 5/1982 United Kingdom .

OTHER PUBLICATIONS

IEEE Transactions of Electron Devices, vol. 35, No. 2 Feb. 1989, pp. 230–239, New York, U.S.; C. Y. Lu et al.: "An Analog/Digital BCDMOS Technology with Dielectric Isolation—Devices and Processes".

*Primary Examiner*—William D. Larkins
*Assistant Examiner*—Carl Whitehead, Jr.
*Attorney, Agent, or Firm*—Brumbaugh, Graves, Donohue & Raymond

[57] ABSTRACT

A MOS device comprising a parallel array of a plurality of unit structures on a substrate, each unit structure including a first semiconductor layer of a first conductivity type, an oxide layer disposed on a major surface of the first semiconductor layer, a control electrode formed on the oxide layer, and second and third semiconductor layers separated from each other by the first semiconductor layer. The electric current flowing through a surface layer in contact with the oxide layer is controlled by the voltage applied to the control electrode, and the oxide layer is relatively thick between the first semiconductor layer and the control electrode on the periphery of the unit structures located on the periphery of the substrate and relatively thin between the first semiconductor layer and control electrode in other regions of the MOS device.

3 Claims, 2 Drawing Sheets

INSULATED GATE SEMICONDUCTOR DEVICE

This is a continuation of Ser. No. 07/830,491 filed Jan. 23, 1992, now abandoned, which was a continuation of Ser. No. 07/674,414 filed Mar. 22, 1991, now abandoned, which was a continuation of Ser. No. 07/447,365, filed Dec. 7, 1989, now abandoned. The present invention relates to a MOS (metal oxide semiconductor) device such as a power MOSFET (MOS field effect transistor), insulated gate bipolar transistor, power IC (integrated circuit), or high voltage IC, having MOS construction on its upper surface to control the electric current flowing between the upper and lower surfaces of its semiconductor substrate.

BACKGROUND OF THE INVENTION

One example of a prior art MOS construction is an n-channel insulated gate bipolar transistor, of which FIGS. 2(a) and 2(b) illustrate fragmentary cross sections. FIG. 2(a) shows the edge termination structure of this construction, which is usually disposed on the outer periphery of a semiconductor substrate. FIG. 2(b) is a cross-sectional view principally depicting the gate electrode.

This n-channel insulated gate bipolar transistor is fabricated by the following process. First, an n+ buffer layer 2 and an n− bulk layer 3 are grown epitaxially on a p+ substrate 1 of silicon. An oxide film is formed thereon by thermal oxidation and the unwanted portions are removed by photolithography to create a field oxide film 4. Next, a thin gate oxide film 5 also is formed by thermal oxidation. Thereafter, polycrystalline silicon doped with an impurity such as phosphorous is deposited thereon by the CVD process and etched by photolithography to form a a gate layer 6, a first field plate 61, and a first drain plate 62.

In this configuration, the p-type base layer 7 and a drain contact layer 71 are formed simultaneously by ion implantation and thermal diffusion. The contact layer 71 is not always necessary, and in some cases may not be included. In other cases, it is an n+ layer. After an n+ source layer 8 is formed by ion implantation and thermal diffusion, an insulating film 9 is formed by the CVD process and photolithography, for example. A source electrode 11, a gate electrode 12 consisting of Al and Si, a second field plate 13, and a second drain plate 14 are formed by sputtering and photolithography, for example. A protection film 10 made from silicon nitride, for example, is formed by the CVD process and photolithography. A drain electrode 15 contacting the p+ substrate 1 is formed by depositing metal as a film by vapor deposition.

It is to be noted that this is only one example of the prior art techniques and that various other contructions are available. For example, a p+ layer that is deeper and more heavily doped than the p-type base layer 7 may be formed inside the base layer before or after the formation of the field oxide film 4.

In the above-described structure, the edge termination structure on the outer periphery consists of two stages of plate, i.e., field plate 61 and drain plate 62. The second field plate 13 and the second drain plate 14 may be formed separately from Al and Si. A guard ring making use of a p-type diffused layer may be employed. Both a guard ring and field plates may be used. Field plates and drain plates may be electrically connected using a layer of high resistance. Despite these variations however, the unit structure of any type of n-channel insulated gate bipolar transistor includes the gate layer 6 which is formed on the p-type base layer 7 via the gate oxide film 5, and the base layer 7 separating the n+ source layer 8 from the n− bulk layer 3. Generally, a plurality of such unit structures are arranged parallel. FIGS. 2(a) and 2(b) show the outer portions on which a number of unit structures are arranged.

In the prior art n-channel insulated gate bipolar transistor, a positive voltage is applied to the gate electrodes 12 of all the unit structures. The voltage is applied to the gate layer 6 on each p-type base layer. Electric current is caused to flow between the drain electrodes 15 and the source electrodes 11 or a negative voltage is applied to the gate electrodes 12 to cut off electric current or block the high voltage applied between the drain electrodes 15 and the source electrodes 11. In this way, the semiconductor device is used to control electric power.

The prior art insulated gate bipolar transistor described in conjunction with FIG. 2 is limited in its application, due to steps A in the outer portions of the numerous unit structures resulting from the difference in thickness between the gate oxide film 5 and the field oxide film 4. When the bipolar transistor is conducting, electric current is concentrated in these outer portions. When the transistor is not conducting, a strong electric field is applied to these regions. When an excessive voltage is applied to the bipolar transistor, avalanche current flows and also is concentrated in these regions. That is, the outer regions, which are exposed to the severest conditions, have the steps A of oxide film, which cause electric field concentration. The prior art n-channel insulated gate bipolar transistor is therefore not a rugged semiconductor device under higher voltage or current conditions. For example, when excessive current is cut off or excessive voltage is applied, the steps A of the oxide film often lead to destruction of the semiconductor device. This is greatly detrimental to the quality and reliability of the semiconductor device.

It is an object of the present invention to provide a MOS device in which electric field concentration due to steps between gate oxide film and adjacent field oxide film is not produced, and which offers high quality and high reliability.

SUMMARY OF THE INVENTION

The above object is achieved by a MOS device comprising a parallel array of a plurality of unit structures on a substrate which has been modified at the periphery to avoid steps. Each unit structure in the claimed device includes a first semiconductor layer of a first conductivity type, an oxide layer disposed on a major surface of the first semiconductor layer, a control electrode formed on the oxide layer, and second and third semiconductor layers separated from each other by the first semiconductor layer, wherein electric current flowing through one of said second and third semiconductor layers in contact with the oxide layer is controlled by the voltage applied to the control electrode, and wherein the oxide layer is relatively thick between the first semiconductor layer and the control electrode on the periphery of those unit structures located on the periphery of the substrate and relatively thin between the first semiconductor layer and control electrode in all other regions of the MOS device.

DETAILED DESCRIPTION OF THE INVENTION

Where a plurality of MOS devices are arranged on the same semiconductor substrate, the outer regions of the substrate are exposed to the severest conditions. In accordance with the claimed invention, therefore, a relatively thick oxide layer, e.g., a field oxide film, is used in these outer regions. In other areas of the MOS device, a relatively thin oxide layer, e.g., a gate oxide film, is employed. In the outer regions, the oxide film is thick, making the device is highly durable. Consequently, the semiconductor device is highly resistant to excessive currents and excessive voltages, and the quality and reliability of the device are assured.

Figure 1A:
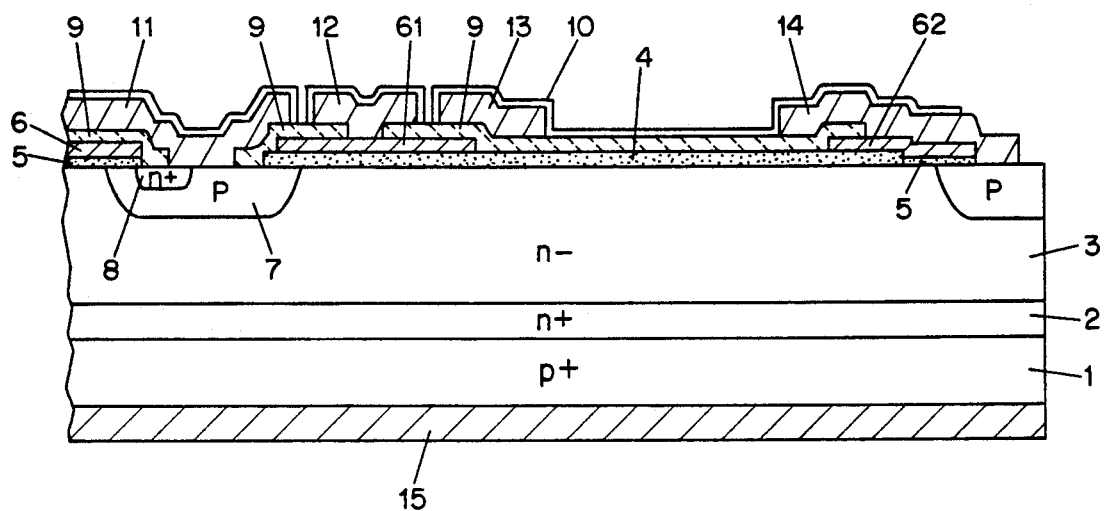
FIG. 1(a) is a cross-sectional view of the edge termination structure of the outer regions of an insulated gate bipolar transistor according to the invention.
Figure 1B:
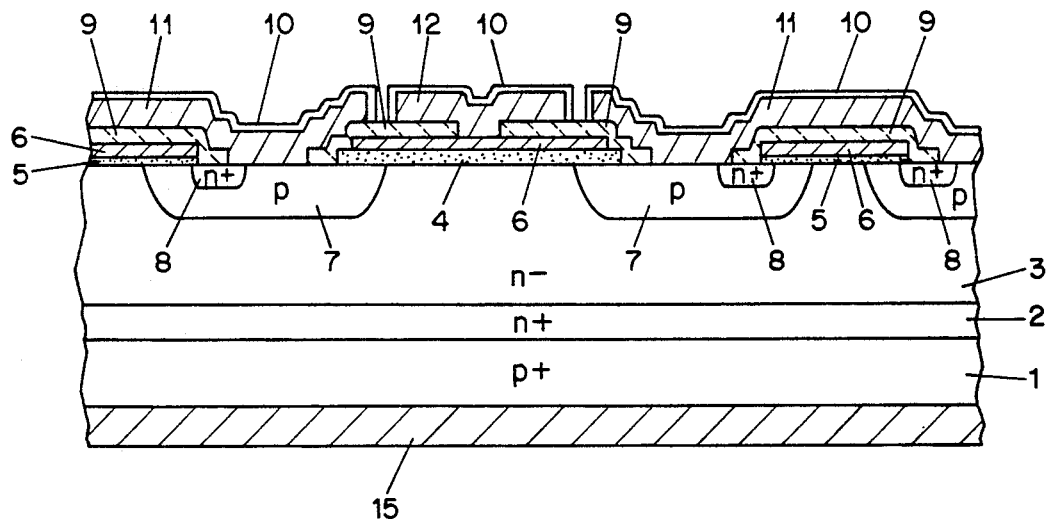
FIG. 1(b) is a cross-sectional view principally depicting the gate electrode of the transistor shown in FIG. 1(a)
Figure 2A:
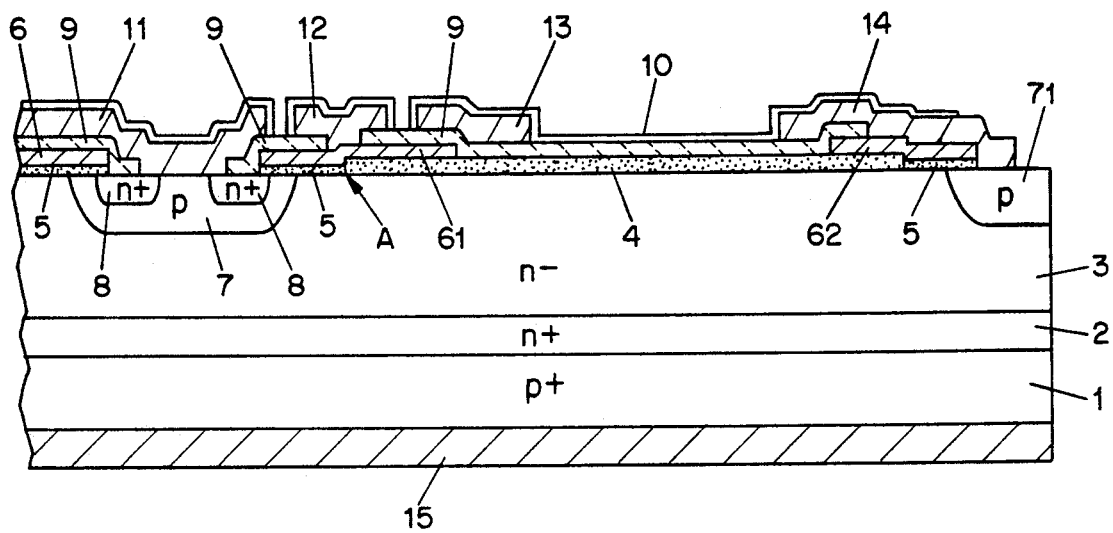
FIGS. 2(a) and 2(b) are cross-sectional views of the prior art insulated gate bipolar transistor, corresponding to FIGS. 1(a) and 1(b).
Figure 2B:
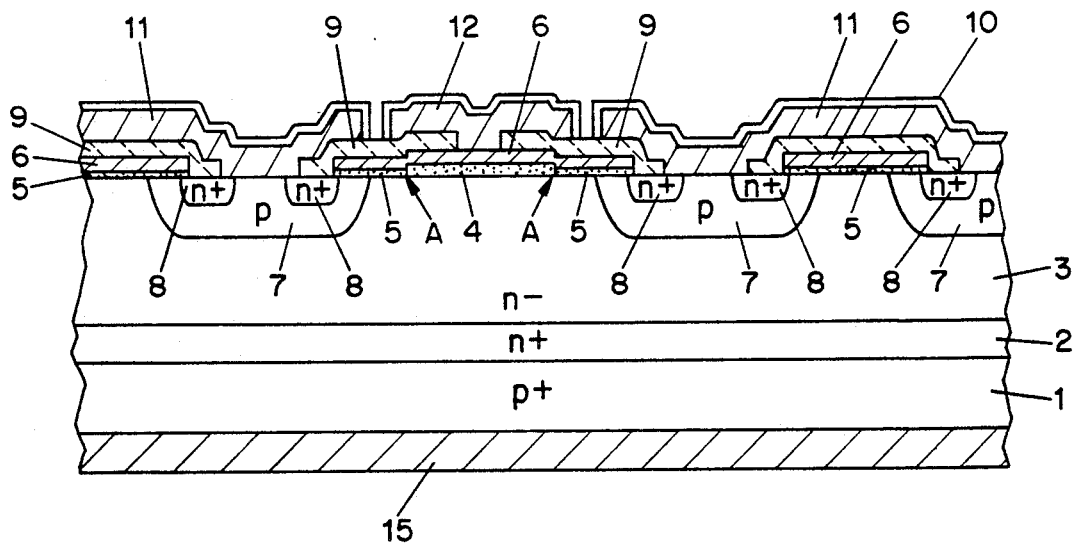

FIGS. 1(a) and 1(b) are fragmentary cross sections of an n-channel insulated gate bipolar transistor according to the claimed invention, corresponding to FIGS. 2(a) and 2(b). It is to be noted that like components are denoted by like reference numerals in these figures. As can be seen by comparing FIG. 2(b) with FIG. 1(b), in the present invention the n-type source layer 8 is not formed in the p-type base layer 7 in the portions corresponding to the outer portions of the semiconductor substrate. Furthermore, in the claimed invention, the field oxide film 4 is extended to overlay the base layer 7 at its end, and the gate layer 6 is formed on the field oxide film 4. Also, as can be seen by comparing FIG. 2(a) with FIG. 1(a), in the claimed invention field plate 61 is formed totally on the field oxide film 4. Consequently, none of the steps A of the prior art shown in FIG. 2 exist. The claimed insulated gate bipolar transistor shown in FIG. 1 is fabricated in exactly the same manner as the insulated gate bipolar transistor shown in FIG. 2. The difference is that in the claimed invention, the mask used to form the field oxide film 4 by photolithographical techniques and the mask employed to form n+ source layer 8 by photolithographical techniques are changed. To simplify the manufacturing process, the prior art mask can be used in forming the n+ source layer 8 by photolithographical techniques. In this case, the resistance to breakdown is improved considerably.

EXAMPLE

An n-channel insulated gate bipolar transistor was prepared according to the claimed invention. The resulting device had ratings of 600 V and 75 A. Excessive current of 500 A was repeatedly cut off while the device was shorted to a DC power supply of 400 V. It has been confirmed that the device did not deteriorate at all.

The present invention is not limited to the insulated gate bipolar transistor of the construction shown in FIG. 1. The claimed invention also applies to an insulated gate bipolar transistor that employs second and third p type diffused layers, as well as the p-type base layer 8 already described in connection with FIG. 2. Furthermore, the claimed invention can be applied to insulated gate bipolar transistors of other various robust constructions. The invention is also not restricted to the present example of insulated gate bipolar transistor, and can be applied to a power MOSFET, power IC, high voltage IC or other various MOS devices.

I claim:

1. A MOS device comprising an array of a plurality of gate electrode unit structures on a substrate, said array having a set of peripheral unit structures along each edge of the array and nonperipheral unit structures within the center of the array, each unit structure including a first semiconductor layer of a first conductivity type, being a base layer;

second and third semiconductor layers of a second conductivity type separated from each other by the first semiconductor layer, the third semiconductor layer being enclosed by the first semiconductor layer;

a gate electrode overlaying the second semiconductor layer and an oxide layer, wherein the oxide layer in said set of peripheral unit structures is a relatively thick field oxide film of substantially constant thickness interposed between said second semiconductor layer and the gate electrode, the field oxide film overlaying at least part of the first semiconductor layer and extending beyond the gate electrode in at least a first direction toward the third semiconductor layer and a second direction opposite the first direction, and wherein the oxide layer in said nonperipheral unit structures is a relatively thin gate oxide film interposed between said second semiconductor layer and the gate electrode.

2. The device of claim 1 wherein said substrate has a top surface and a bottom surface, said device having said gate electrode unit structures on said top surface to control electric current flowing between said top surface and said bottom surface, said device further comprising a gate layer overlaying said first semiconductor layer and said second semiconductor layer, wherein said gate layer contacts part of said gate electrode in said set of peripheral unit structures.

3. The device of claim 2 wherein said set of peripheral unit structures are formed symmetrically about said gate electrode.

* * * * *